US012327997B2

(12) United States Patent
Galens et al.

(10) Patent No.: US 12,327,997 B2
(45) Date of Patent: Jun. 10, 2025

(54) INTRINSICALLY SAFE CIRCUITRY

(71) Applicant: G.W. Lisk Company, Inc., Clifton Springs, NY (US)

(72) Inventors: Peter Galens, Clifton Springs, NY (US); David J. Trapasso, Bloomfield, NY (US)

(73) Assignee: G.W. Lisk Company, Inc., Clifton Springs, NY (US)

( * ) Notice: Subject to any disclaimer, the term of this patent is extended or adjusted under 35 U.S.C. 154(b) by 0 days.

(21) Appl. No.: 17/285,267

(22) PCT Filed: Dec. 20, 2019

(86) PCT No.: PCT/US2019/067847
§ 371 (c)(1),
(2) Date: Apr. 14, 2021

(87) PCT Pub. No.: WO2020/132440
PCT Pub. Date: Jun. 25, 2020

(65) Prior Publication Data
US 2021/0376597 A1   Dec. 2, 2021

Related U.S. Application Data

(60) Provisional application No. 62/783,722, filed on Dec. 21, 2018.

(51) Int. Cl.
*H01H 47/00* (2006.01)
*H01F 7/18* (2006.01)
(Continued)

(52) U.S. Cl.
CPC ............... *H02H 9/008* (2013.01); *H01F 7/18* (2013.01); *H02H 9/02* (2013.01)

(58) Field of Classification Search
CPC ............. H02H 9/008; H02H 9/02; H01F 7/18
(Continued)

(56) References Cited

U.S. PATENT DOCUMENTS 3,609,511 A     9/1971  Risberg
3,612,895 A  *  10/1971  Niedra ................. H03K 17/601
                                                    307/419

(Continued)

FOREIGN PATENT DOCUMENTS

KR   10-2005-0105893 A   11/2005
KR   10-2013-0118396 A   10/2013

*Primary Examiner* — Jared Fureman
*Assistant Examiner* — Lucy M Thomas
(74) *Attorney, Agent, or Firm* — Harter Secrest & Emery LLP; Timothy W. Menasco, Esq.

(57) ABSTRACT

A circuit for preventing sparks. The circuit having a power storage component having a first power storage end and a second power storage end; a power source electrically connected to the power storage component, the power source having a first power source end and a second power source end; a first current directional component electrically connected to the power storage component and having a first current direction; a first power absorption component electrically connected to the power storage component and having a current direction, the first current directional component and the first power absorption component being electrically connected to the power storage component in parallel; and at least one switch electrically connected to the power storage component.

7 Claims, 6 Drawing Sheets

(51) Int. Cl.
*H01H 47/14* (2006.01)
*H02H 9/00* (2006.01)
*H02H 9/02* (2006.01)

(58) Field of Classification Search
USPC .......................................................... 361/166
See application file for complete search history.

(56) References Cited

U.S. PATENT DOCUMENTS

| | | | | |
|---|---|---|---|---|
| 3,906,294 | A * | 9/1975 | Lourigan | H03K 17/292 361/162 |
| 4,246,621 | A * | 1/1981 | Tsukioka | F16K 31/0675 361/111 |
| 4,329,546 | A * | 5/1982 | Montesi | H04M 1/312 379/412 |
| 4,602,309 | A * | 7/1986 | Gaude | H01F 7/1872 361/210 |
| 5,056,144 | A * | 10/1991 | Cornelius | H03B 9/142 331/41 |
| 8,059,382 | B2 | 11/2011 | Schmidt | |
| 8,164,865 | B2 * | 4/2012 | Critchley | H01H 47/325 361/8 |
| 8,848,332 | B2 | 9/2014 | Schmidt | |
| 9,450,636 | B2 | 9/2016 | Yeoh et al. | |
| 9,768,694 | B2 | 9/2017 | Kemp et al. | |
| 2011/0094589 | A1 * | 4/2011 | Jacob | H01F 7/1805 137/1 |
| 2011/0317321 | A1 | 12/2011 | Vogel | |
| 2019/0028099 | A1 * | 1/2019 | Wilson | H03K 17/732 |
| 2020/0388423 | A1 * | 12/2020 | Strauss | F16K 31/0675 |

\* cited by examiner

INTRINSICALLY SAFE CIRCUITRY

BACKGROUND OF THE INVENTION

Field of the Invention

The present invention relates to circuitry, and more particularly to circuitry having components that provide an intrinsically safe circuit.

Description of Related Art

To keep energy stored in a coil or a power storage element from experiencing a spark when the coil or solenoid is deactivated, diodes are typically placed in parallel with the coil. The parallel diodes clamp the voltage across the coil, thereby preventing a spark from occurring in the circuit. However, this process takes up to 500 milliseconds to be de-energized and "safe." Accordingly, a need exists for a circuit that is intrinsically safe and deactivates in a timely manner.

BRIEF SUMMARY OF THE INVENTION

In view of the foregoing, it is an object of the present disclosure to provide a method and apparatus for an intrinsically safe circuit.

A first exemplary embodiment of the present disclosure provides a circuit including: a power storage component having a first power storage end and a second power storage end, a power source electrically connected to the power storage component, the power source having a first power source end and a second power source end, a first current directional component electrically connected to the power storage component and having a first current direction, a first power absorption component electrically connected to the power storage component and having a current direction, the first current directional component and the first power absorption component being electrically connected to the power storage component in parallel, and at least one switch electrically connected to the power storage component.

The circuit may further include a second current directional component that is electrically connected to the power storage component and has a second current direction, the second current direction of the second current directional component corresponding to the first current direction of the first current directional component, the second current directional component and the first current directional component being electrically connected to the power storage component in parallel. The circuit may further include a third current directional component that has a third current direction, the third current directional component electrically connected to the power source in series, wherein the third current directional component maintains a polarity of the power source. The at least one switch may be electrically connected to the power storage component in series. The at least one switch may be two switches, the two switches including a first switch and a second switch that are electrically connected to the power storage component in series. The first switch may be electrically connected to the first power source end and the first power storage end, the second switch being electrically connected to the second power storage end and the second power source end, the first switch and the second switch being in series with the power storage component and the first power absorption component. The circuit may further include a controller that is configured to control the at least one switch. The at least one switch may be further electrically connected to the power source. The at least one switch may be configured to be in an open position when the power source is turned off. The at least one switch may be a metal-oxide-semiconductor field-effect transistor (MOSFET) switch. The first power absorption component may include: a fourth current directional component electrically connected to the power storage component and having a fourth current direction, the first current direction of the first current directional component corresponding to the fourth current direction of the fourth current directional component, and a fifth current directional component electrically connected to the fourth current directional component in series and having a fifth current direction opposite to the fourth current direction of the fourth current directional component, the fifth current directional component being configured to switch current direction when the fifth current directional component reaches a first voltage threshold. The first power absorption component may include: a fourth current directional component electrically connected to the power storage component and having a fourth current direction, the first current direction of the first current directional component corresponding to the fourth current direction of the fourth current directional component, a first capacitor electrically connected to the power storage component, and a first resistor electrically connected to the power storage component, the fourth current directional component, the first capacitor, and the first resistor being connected in series. The first power absorption component may include: a first capacitor electrically connected to the power storage component, and a first resistor electrically connected to the power storage component, the first capacitor and the first resistor being connected in series.

A method is provided including: (a) providing a power storage component having a first power storage end and a second power storage end, (b) providing a power source connected to the power storage component, the power source having a first power source end and a second power source end, (c) providing a first current directional component connected to the power storage component and having a first current direction, (d) providing a first power absorption component electrically connected to the power storage component and having a current direction, the first current directional component and the first power absorption component being electrically connected to the power storage component in parallel, and (e) providing at least one switch electrically connected to the power storage component.

The method may further include providing a second current directional component electrically connected to the power storage component and having a second current direction, the second current direction of the second current directional component corresponding to the first current direction of the first current directional component, the second current directional component and the first current directional component being electrically connected to the power storage component in parallel. The method may further include providing a third current directional component having a third current direction, the third current directional component electrically connected to the power source in series, wherein the third current directional component maintains a polarity of the power source. The at least one switch may be electrically connected to the power storage component in series. The at least one switch may be two switches, the two switches including a first switch and a second switch that are electrically connected to the power storage component in series. The first power absorption component may include: a fourth current directional component electrically connected to the power storage component and having a fourth current direction, the first current direction of the first current directional component corresponding to the fourth current direction of the fourth current directional component, and a fifth current directional component electrically connected to the fourth current directional component in series and having a fifth current direction opposite to the fourth current direction of the fourth current directional component, the fifth current directional component being configured to switch current direction when the fifth current directional component reaches a first voltage threshold. The first power absorption component may include: a fourth current directional component electrically connected to the power storage component and having a fourth current direction, the first current direction of the first current directional component corresponding to the fourth current direction of the fourth current directional component, a first capacitor electrically connected to the power storage component, and a first resistor electrically connected to the power storage component, the fourth current directional component, the first capacitor, and the first resistor being connected in series. The first power absorption component may include: a first capacitor electrically connected to the power storage component, and a first resistor electrically connected to the power storage component, the first capacitor and the first resistor being connected in series.

A method of preventing sparking is provided. The method including: (a) powering, by a power source having a first power source end and a second power source end, a circuit including: (i) a power storage component having a first power storage end and a second power storage end, (ii) a first current directional component electrically connected to the power storage component and having a first current direction, (iii) a first power absorption component electrically connected to the power storage component and having a current direction, the first current directional component and the first power absorption component being electrically connected to the power storage component in parallel, and (iv) at least one switch electrically connected to the power storage component, (b) disconnecting the power source from the circuit, and (c) opening the at least one switch allowing a current to flow through the first power absorption component in the current direction of the first power absorption component.

The circuit may further include a controller that is configured to control the at least one switch. The controller may be operable to disconnect the circuit from the power source. The power storage component and the first power absorption component may be operable to restrict at least one of an upper and lower extreme of a voltage from the power source. The opening of the at least one switch may cause a voltage across the power storage component and the first power absorption component. The voltage across the power storage component and the first power absorption component may reach a first voltage threshold of the first power absorption component, thereby allowing a flow of current through the first power absorption component from the power storage component. The first power absorption component may include: a fourth current directional component electrically connected to the power storage component and having a fourth current direction, the first current direction of the first current directional component corresponding to the fourth current direction of the fourth current directional component, and a fifth current directional component electrically connected to the fourth current directional component in series and having a fifth current direction opposite to the fourth current direction of the fourth current directional component, the fifth current directional component being configured to switch current direction when the fifth current directional component reaches a first voltage threshold. The first power absorption component may include: a fourth current directional component electrically connected to the power storage component and having a fourth current direction, the first current direction of the first current directional component corresponding to the fourth current direction of the fourth current directional component, a first capacitor electrically connected to the power storage component, and a first resistor electrically connected to the power storage component, the fourth current directional component, the first capacitor, and the first resistor being connected in series. The first power absorption component may include: a first capacitor electrically connected to the power storage component, and a first resistor electrically connected to the power storage component, the first capacitor and the first resistor being connected in series.

A second exemplary embodiment of the present disclosure provides a circuit including: a power storage component having a first power storage end and a second power storage end, a power source electrically connected to the power storage component, the power source having a first power source end and a second power source end, a first current directional component electrically connected to the power storage component and having a first current direction, a first power absorption component electrically connected to the power storage component and having a current direction, the first current directional component and the first power absorption component being electrically connected to the power storage component in parallel, and at least two switches, a first switch being electrically connected to the power storage component and a second switch being electrically connected to the power source.

A third exemplary embodiment of the present disclosure provides a circuit including: a power storage component having a first power storage end and a second power storage end, a power source electrically connected to the power storage component, the power source having a first power source end and a second power source end, a first resistor electrically connected to the power storage component in parallel, and at least one switch that is electrically connected to the power storage component and the power source.

A fourth exemplary embodiment of the present disclosure provides a circuit including: a power storage component having a first power storage end and a second power storage end, a power source electrically connected to the power storage component, the power source having a first power source end and a second power source end, a first current directional component electrically connected to the power storage component and having a first current direction, a first resistor electrically connected to the first current directional component in series, the first current directional component and the first resistor being electrically connected to the power storage component in parallel, and at least one switch that is electrically connected to the power storage component and the power source.

A fifth exemplary embodiment of the present disclosure provides a circuit including: a power storage component having a first power storage end and a second power storage end, a power source electrically connected to the power storage component, the power source having a first power source end and a second power source end, a first current directional component electrically connected to the power storage component and having a first current direction, a first resistor electrically connected to the first current directional component in series, a first capacitor electrically connected to the first resistor in parallel, the first current directional component and the first resistor being electrically connected to the power storage component in parallel, and at least one switch that is electrically connected to the power storage component and the power source.

A sixth exemplary embodiment of the present disclosure provides a circuit including: a power storage component having a first power storage end and a second power storage end, a power source electrically connected to the power storage component, the power source having a first power source end and a second power source end, a first current directional component electrically connected to the power storage component and having a first current direction, a first power absorption component electrically connected to the power storage component and having a current direction, the first current directional component and the first power absorption component being electrically connected to the power storage component in parallel, a first resistor electrically connected to the power storage component, a first capacitor electrically connected to the power storage component, the first resistor and the first capacitor being electrically connected to the power storage component in parallel, and at least one switch that is electrically connected to the first capacitor.

The following will describe embodiments of the present disclosure, but it should be appreciated that the present disclosure is not limited to the described embodiments and various modifications of the invention are possible without departing from the basic principles. The scope of the present disclosure is therefore to be determined solely by the appended claims.

BRIEF DESCRIPTION OF THE SEVERAL VIEWS OF THE DRAWING(S)

DETAILED DESCRIPTION OF THE INVENTION

Figure 1:
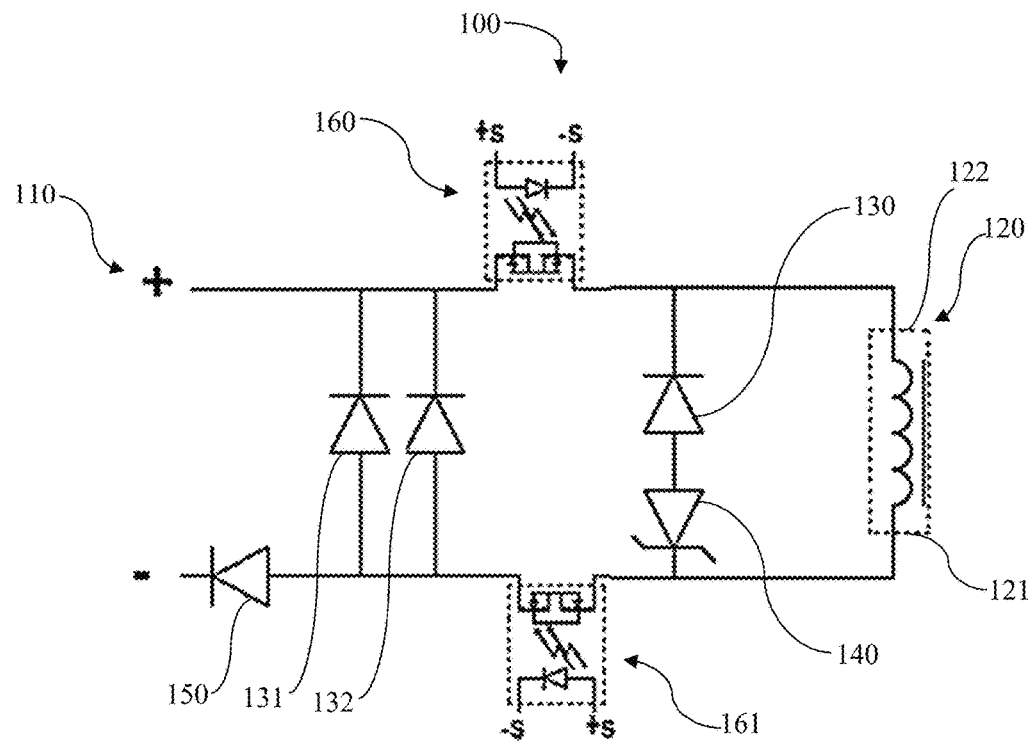
FIG. 1 is a schematic view of a first embodiment of an exemplary circuit suitable for performing embodiments of the present disclosure.

At the outset, it should be clearly understood that like reference numerals are intended to identify the same structural elements, portions or surfaces consistently throughout the several drawing figures, as such elements, portions or surfaces may be further described or explained by the entire written specification, of which this detailed description is an integral part. Unless otherwise indicated, the drawings are intended to be read (e.g., cross-hatching, arrangement of parts, proportion, degree, etc.) together with the specification, and are to be considered a portion of the entire written description of this invention. As used in the following description, the terms "horizontal", "vertical", "left", "right", "up" and "down", as well as adjectival and adverbial derivatives thereof (e.g., "horizontally", "rightwardly", "upwardly", etc.), simply refer to the orientation of the illustrated structure as the particular drawing figure faces the reader. Similarly, the terms "inwardly" and "outwardly" generally refer to the orientation of a surface relative to its axis of elongation, or axis of rotation, as appropriate.

The detailed description set forth below is intended as a description of various configurations of the present invention and is not intended to represent the only configurations in which the present invention may be practiced. It will be apparent, however, to those of ordinary skill in the art that the present invention is not limited to the specific details set forth herein and may be practiced without these specific details.

Referring now to the drawings, and more particularly to FIG. 1 thereof, an exemplary circuit is provided, of which a first embodiment is generally indicated at 100. The circuit 100 is shown as broadly including a power source 110, a power storage component 120, a first diode 130, a second diode 131, a third diode 132, a zener diode 140, a polarity protection diode 150, a first switch 160, and second switch 161. The power source 110 may be an alternating current (AC) power source or a direct current (DC) power source. The power source 110 and the power storage component 120 have corresponding positive and negative terminals.

The first diode 130 is electrically coupled in series with the zener diode 140, which are electrically coupled in parallel with the power storage component 120. Each of the first diode 130 and the zener diode 140 include an anode and a cathode, the anode of the first diode 130 being electrically connected to the anode of the zener diode 140. The first diode 130, the second diode 131, the third diode 132, and the polarity protection diode 150 (also referred to as current directional components) are circuit components that permit the flow of current in one direction. Diodes also allow flow of current from an anode to a cathode. The zener diode 140 is a circuit component that directs current in a specific direction (e.g., anode to cathode of the zener diode 140) and is configured to change the direction of the current based on a voltage across the zener diode 140. Moreover, the power storage component 120 is a circuit component that stores energy. Embodiments of the power storage component 120 include a coil, solenoid, winding, or any other component suitable for the intended purpose and understood by a person of ordinary skill in the art.

The first switch 160 and the second switch 161 allow a flow of current in a first position and are configured to disconnect the power source 110 from the terminals of the power storage component 120 to prevent a spark from occurring at the terminals of the power source 110. The first switch 160 and the second switch 161 may also be controlled by controllers that are operated independently from the power source 110 or receive power from the power source 110. The first switch 160 and the second switch 161 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), or any other switch suitable for the intended purpose and understood by a person of ordinary skill in the art.

The second diode 131 and the third diode 132 may be a redundant pair of diodes that are electrically coupled in parallel with each other between the power source 110 and the first and second switches 160, 161. Also, connected in parallel to the first diode 130 and the power storage component 120, the second diode 131 and the third diode 132 allow current in the same direction of the first diode 130. The cathode side is closest to the positive end of the power source 110, thus, current does not flow from the positive end of the power source 110 through the second diode 131 and the third diode 132. The second diode 131 and the third diode 132 assist the circuit 100 by preventing a spark between the power storage component 120 from the power source 110 in case the first switch 160 and the second switch 161 fail.

The polarity protection diode 150 provides polarity protection to the circuit 100 by prohibiting unwanted changes of polarity in the circuit 100. The polarity protection diode 150 is also electrically coupled to the negative terminal of the power source 110. Cathode or negative end of a diode is adjacent to and directed toward negative end if the power source polarity protection diode 150 can also be located adjacent to the positive end of the power source 110 such that anode is closet.

Initially, in practice, the circuit 100 is energized by the power source 110. With the first switch 160 and the second switch 161 in a closed position, the power storage component 120 is energized and stores power. The first diode 130 and the zener diode 140 may be a power absorption component that clamp a decay voltage of the power storage component 120 at a higher value than a typical diode. As such, the current through the power storage component 120 will decay at a faster rate.

In this embodiment, current will pass from the positive end of the power source 110, through the first switch 160 (in the closed position), and then to the power storage component 120. Because of the direction of the first diode 130, the second diode 131, and the third diode 132, current does not flow from the cathode end to the anode end of each respective diode. When the power source 110 is turned on and the first switch 160 and the second switch 161 are in a closed position, the power storage component 120 will gain potential energy and current will flow through the second switch 161 (in the closed position), the polarity protection diode 150, and then to the negative end of the power source 110. The zener diode 140 will prevent a flow of current to the first diode 130 because of the direction of the zener diode 140 when the power source 110 is turned off. The electrical potential in the power storage component 120 will want to dissipate when the power source 110 is disconnected from the circuit 100. When power is turned off, the first switch 160 and the second switch 161 will be in an open position, thereby preventing a flow of current to the power storage component 120. As such, current will not be able to flow from the power storage component 120 to the power source 110. Current will then flow from the cathode end to the anode end of the zener diode 140, through the first diode 130, and then back to an end 122 of the power storage component 120, thereby dissipating the electrical potential stored in the power storage component 120. In the instance that one of the first switch 160 or the second switch 161 fails, current flows from an end 121 of the power storage component 120, to the zener diode 140, to the first diode 130, and back to the end 122 of the power storage component 120. If both of the first switch 160 and the second switch 161 fail to open, then the current will flow from the end 121 through the second diode 131 and the third diode 132 and then back to the end 122 of the power storage component 120 in a circular manner.

Figure 2:
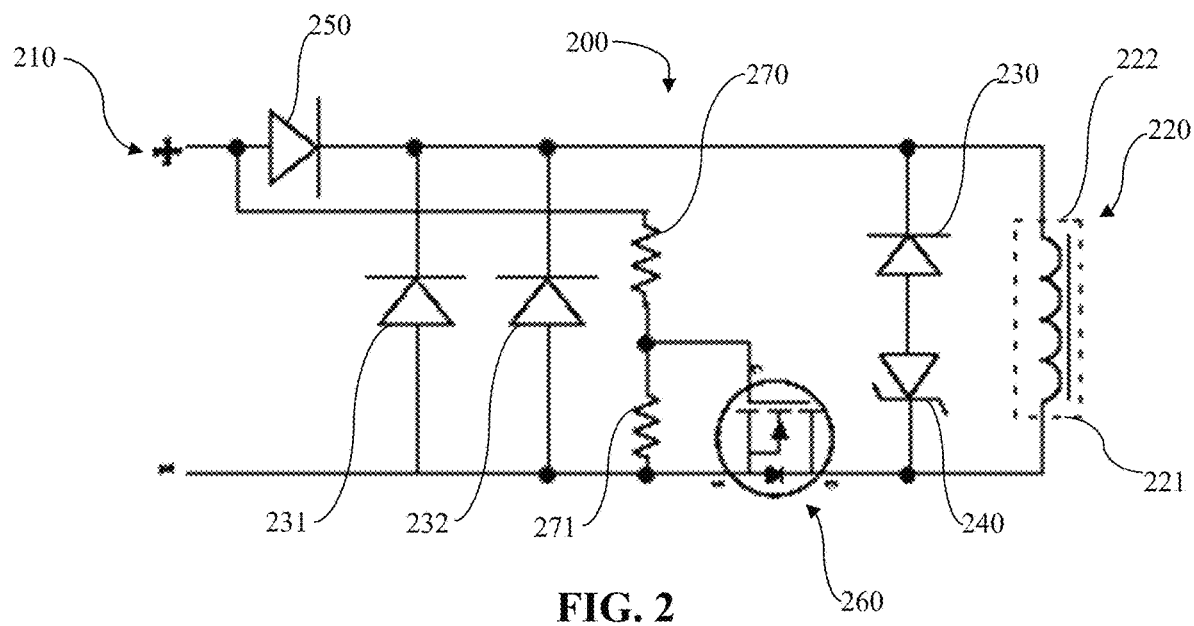
FIG. 2 is a schematic view of a second embodiment of an exemplary e circuit.

Referring to FIG. 2, an exemplary circuit is provided, of which a second embodiment is generally indicated at 200. The circuit 200 is shown as broadly including a power source 210, a power storage component 220, a first diode 230, a second diode 231, a third diode 232, a zener diode 240, a polarity protection diode 250, a first switch 260, a first resistor 270, and a second resistor 271. The power source 210 may be an alternating current (AC) power source or a direct current (DC) power source. The power source 210 and the power storage component 220 have corresponding positive and negative terminals.

The first diode 230 is electrically coupled in series with the zener diode 240, which are electrically coupled in parallel with the power storage component 220. The first diode 230, the second diode 231, the third diode 232, and the zener diode 240 are in parallel to the power storage component 220 and the power source 210. Each of the first diode 230 and the zener diode 240 include an anode and a cathode, the anode of the first diode 230 being electrically connected to the anode of the zener diode 240. The first diode 230, the second diode 231, the third diode 232, and the polarity protection diode 250 are circuit components that permit the flow of current in one direction. The zener diode 240 is a circuit component that directs current in a specific direction (e.g., anode to cathode of the zener diode 240) and is configured to change the direction of the current based on a voltage across the zener diode 240. Moreover, the power storage component 220 is a circuit component that stores energy such as a coil, solenoid, winding, or any other component suitable for the intended purpose and understood by a person of ordinary skill in the art.

The first switch 260 is configured to disconnect the power source 210 from the terminals of the power storage component 220 to prevent a spark from occurring at the terminals of the power storage component 220. The first switch 260 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), or any other switch suitable for the intended purpose and understood by a person of ordinary skill in the art.

In the embodiment where the first switch 260 is an N-channel MOSFET switch that disconnects the power storage component 220 from the negative terminal of the power source 210, the MOSFET switch consumes very little power and does not require secondary power. In an alternative embodiment, the first switch 260 may be a P-channel MOSFET that disconnects the power storage component 220 from the positive terminal of the power source 210. When power is connected, the MOSFET switch changes to a closed position, thereby providing power to the power storage component 220. When power is disconnected from the circuit 200, the MOSFET switch changes to an open position, thereby preventing power in the power storage component 220 to decay through the zener diode 240 with a decay voltage of the zener diode 240 being at a higher value than a typical diode. As such, the current through the power storage component 220 will decay faster. The first switch 260 disconnects the power from the power source 210 to the external terminals of the power storage component 220, thereby preventing a spark from occurring at the terminals of the power storage component 220.

In this embodiment, current will pass from the positive end of the power source 210, through the polarity protection diode 250, and then to the power storage component 220. Because of the direction of the first diode 230, the second diode 231, and the third diode 232, current does not flow from the cathode end to the anode end of each respective diode. When the power source 210 is turned on and the first switch 260 is in a closed position, the power storage component 220 will gain potential energy and current will flow through the first switch 260 (in the closed position) and then to the negative end of the power source 210. The zener diode 240 will prevent a flow of current to the first diode 230 because of the direction of the zener diode 240 when the power source 210 is turned off. The electrical potential in the power storage component 220 will want to dissipate when the power source 210 is disconnected from the circuit 200. When power is turned off, the first switch 260 will be in an open position, thereby preventing a flow of current to the power storage component 220. As such, current will not be able to flow from the power storage component 220 to the power source 210. Current will then flow from the cathode end to the anode end of the zener diode 140, through the first diode 230, and then back to an end 222 of the power storage component 220, thereby dissipating the electrical potential stored in the power storage component 220. In the instance that the first switch 260 fails, current flows from an end 221 of the power storage component 220, through the second diode 231 and the third diode 232, and then back to the end 222 of the power storage component 220 in a circular manner.

The second diode 231 and the third diode 232 may be a redundant pair of diodes that are electrically coupled in parallel between the power source 210 and the power storage component 220. The second diode 231 and the third diode 232 assist the circuit 200 by preventing a spark between the power storage component 220 from the power source 210 in case the first switch 260 fails.

The polarity protection diode 250 also provides polarity protection to the circuit 200 by prohibiting unwanted changes of polarity in the circuit 200. The polarity protection diode 250 is also electrically coupled to the positive terminal of the power source 210.

Initially, the circuit 200 is energized by the power source 210. With the first switch 260 in a closed position, the power storage component 220 is energized and stores power. The first diode 230 and the zener diode 240 may be a power absorption component that clamp a decay voltage of the power storage component 220 at a higher value than a typical diode. As such, the current through the power storage component 220 will decay at a faster rate.

Reverse Voltage Protection

Figure 3:
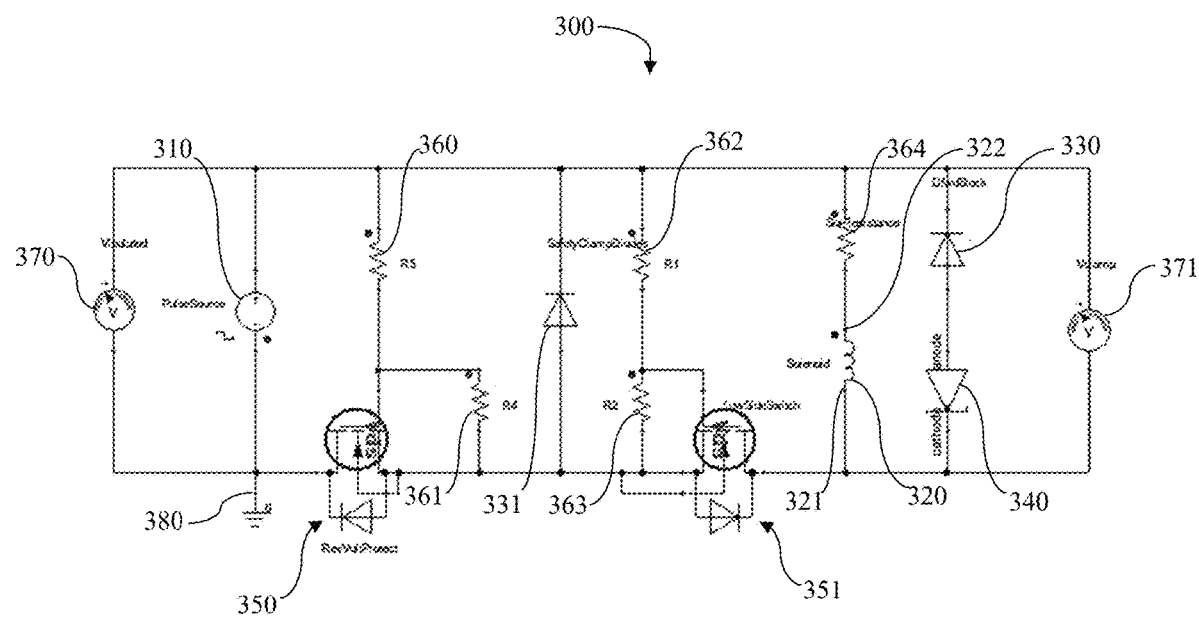
FIG. 3 is a schematic view of a third embodiment of an exemplary circuit.
Figure 4:
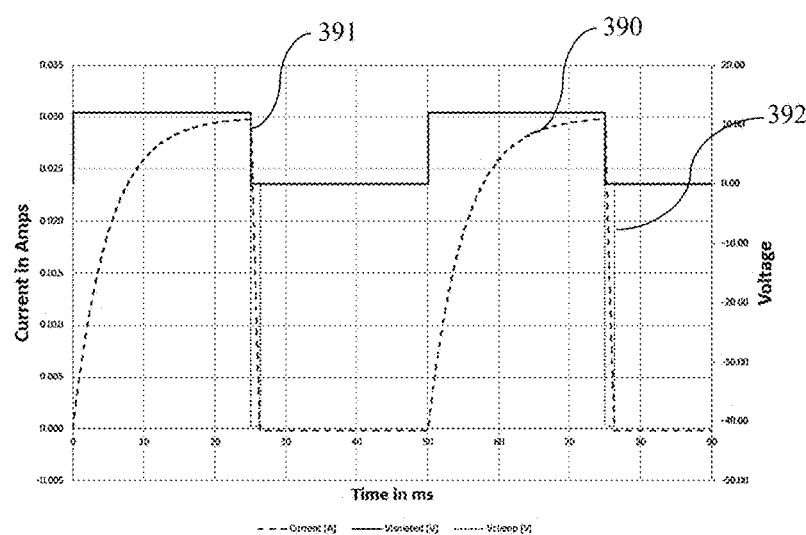
FIG. 4 is a graph of voltage measurements of the circuit of FIG. 3.

Referring to FIGS. 3 and 4, an exemplary circuit is provided, of which a third embodiment is generally indicated at 300. The circuit 300 is shown as broadly including a power source 310, a power storage component 320, a first diode 330, a second diode 331, a zener diode 340, a first switch 350, a second switch 351, a first resistor 360, a second resistor 361, a third resistor 362, a fourth resistor 363, a fifth resistor 364, and a ground terminal 380.

FIG. 3 also illustrates the circuit 300 with a voltage measurement tool 370 to measure a voltage across the power source 310, and a voltage measurement tool 371 to measure a voltage across the second diode 331. The power source 310 may be an alternating current (AC) power source or a direct current (DC) power source. The power source 310 and the power storage component 320 have corresponding positive and negative terminals.

The first diode 330 is electrically coupled in series with the zener diode 340, which are electrically coupled in parallel with the power storage component 320 and the fifth resistor 364. Each of the first diode 330 and the zener diode 340 include an anode and a cathode, the anode of the first diode 330 being electrically connected to the anode of the zener diode 340. The first diode 330 and the second diode 331 are circuit components that permit the flow of current in one direction. The zener diode 340 is a circuit component that directs current in a specific direction (e.g., anode to cathode of the zener diode 340) and is configured to change the direction of the current based on a voltage across the zener diode 340. Moreover, the power storage component 320 is a circuit component that stores energy such as a coil, solenoid, winding, or any other component suitable for the intended purpose and understood by a person of ordinary skill in the art. The fifth resistor 364 may be a load resistor of the power storage component 320.

The first switch 350 and the second switch 351 are configured to disconnect the power source 310 from the terminals of the power storage component 320 to prevent a spark from occurring at the terminals of the power storage component 320. The first switch 350 and the second switch 351 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), or any other switch suitable for the intended purpose and understood by a person of ordinary skill in the art.

In the embodiment where the first switch 350 and the second switch 351 are N-channel MOSFET switches, the first switch 350 is a reverse voltage protection MOSFET that is in a return path of the current to the power source 310. Having the reverse voltage protection MOSFET in the return path of the current to the power source 310 allows the usage of an N-Channel MOSFET or a P-Channel MOSFET. In this embodiment, the first switch 350 and the second switch 351 disconnect the power storage component 320 from the negative terminal of the power source 310. In an alternate embodiment, the P-Channel MOSFET may be used, whereas the reverse voltage protection MOSFET is positioned next to the power source 310 of the circuit 300. In this embodiment, the first switch 350 and the second switch 351 disconnect the power storage component 320 from the positive terminal of the power source 310.

In this embodiment, when power is connected, the first switch 350 and the second switch 351 change to a closed position, thereby providing power to the power storage component 320. When power is disconnected from the circuit 300, the first switch 350 and the second switch 351 change to an open position, thereby preventing power in the power storage component 320 to decay back to the power source 310.

The first resistor 360 turns on the first switch 350 when the correct polarity (e.g., in a DC circuit) is applied to the input of the circuit 300. The second resistor 361 turns the first switch 350 off quickly when power to the circuit 300 is removed. If a reverse polarity voltage is applied to the circuit 300, the reverse voltage protection MOSFET stays off and inhibits the voltage from being directed to the remainder of the circuit 300.

In this embodiment, current will pass from the positive end of the power source 310 and then to the power storage component 320. Because of the direction of the first diode 330 and the second diode 331, current does not flow from the cathode end to the anode end of each respective diode. When the power source 310 is turned on and the first switch 350 and the second switch 351 are in a closed position, the power storage component 320 will gain potential energy and current will flow through the first switch 350 and the second switch 351 (in the closed position) and then to the negative end of the power source 310. The zener diode 340 will prevent a flow of current to the first diode 330 because of the direction of the zener diode 340 when the power source 310 is turned off. The electrical potential in the power storage component 320 will want to dissipate when the power source 310 is disconnected from the circuit 300. When power is turned off, the first switch 350 and the second switch 351 will be in an open position, thereby preventing a flow of current to the power storage component 320. As such, current will not be able to flow from the power storage component 320 to the power source 310. Current will then flow from the cathode end to the anode end of the zener diode 340, through the first diode 330, and then back to an end 322 of the power storage component 320, thereby dissipating the electrical potential stored in the power storage component 320. In the instance that one of the first switch 350 or the second switch 351 fails, current flows from an end 321 of the power storage component 320, to the zener diode 340, to the first diode 330, and back to the end 322 of the power storage component 320. If both of the first switch 350 and the second switch 351 fail to open, then the current will flow from the end 321 through the second diode 331 and then back to the end 322 of the power storage component 320 in a circular manner.

The reverse voltage protection MOSFET has the advantage of a lower forward voltage drop when compared to a typical diode. The typical diode may have between 0.3 to 0.7 volts drop across the typical diode in the forward conduction direction. MOSFETs may have approximately 1/100th of the voltage drop of the typical diode depending on the type of device that is selected. As such, MOSFETs allow for more of the input voltage from the power source 310 to be applied to the load (e.g., power storage component 320). The circuit 300 provides a faster opening response and less power dissipation.

The second diode 331 may be a redundant diode that is electrically coupled in parallel between the power source 310 and the power storage component 320. The second diode 331 assists the circuit 300 by preventing a spark between the power storage component 320 from the power source 310 in case the second switch 351 fails.

Initially, the circuit 300 is energized by the power source 310. With the first switch 350 and the second switch 351 in a closed position, the power storage component 320 is energized and stores power. The first diode 330 and the zener diode 340 may be a power absorption component that clamp a decay voltage of the power storage component 320 at a higher value than a typical diode. As such, the current through the power storage component 320 will decay at a faster rate.

Referring to FIG. 4, line 390 represents the current across the power storage component 320 of the circuit 300 over a period of time. Line 391 represents the voltage measured by the voltage measurement tool 370 across the power source 310 of the circuit 300 over the period of time. Line 392 represents the voltage measured by the voltage measurement tool 371 across the second diode 331 of the circuit 300 over the period of time.

Energy Absorption and Dissipation Devices

Figure 5:
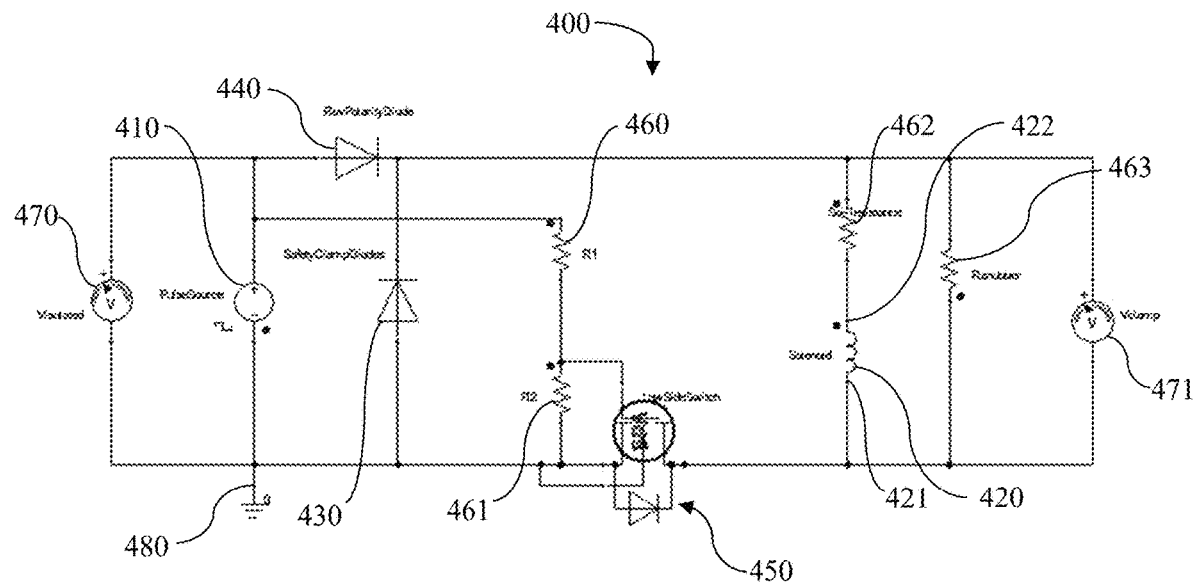
FIG. 5 is a schematic view of a fourth embodiment of an exemplary circuit.
Figure 6:
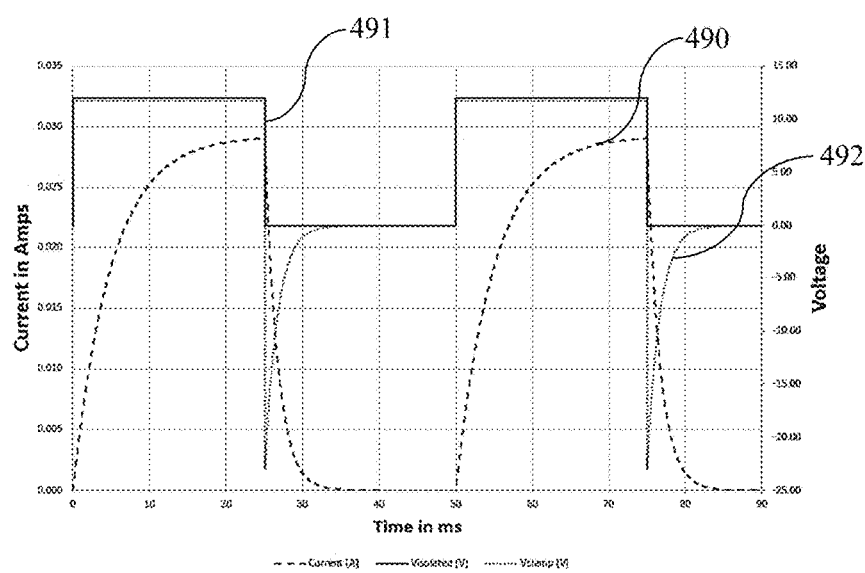
FIG. 6 is a graph of voltage measurements of the circuit of FIG. 5.

Referring to FIGS. 5 and 6, an exemplary circuit is provided, of which a fourth embodiment is generally indicated at 400. The circuit 400 is shown as broadly including a power source 410, a power storage component 420, a first diode 430, a polarity protection diode 440, a first switch 450, a first resistor 460, a second resistor 461, a third resistor 462, a fourth resistor 463, and a ground terminal 480.

FIG. 5 also illustrates the circuit 400 with a voltage measurement tool 470 to measure a voltage across the power source 410, and a voltage measurement tool 471 to measure a voltage across the first diode 430. The power source 410 may be an alternating current (AC) power source or a direct current (DC) power source. The power source 410 and the power storage component 420 have corresponding positive and negative terminals. The power storage component 420 is a circuit component that stores energy such as a coil, solenoid, winding, or any other component suitable for the intended purpose and understood by a person of ordinary skill in the art. The first diode 430 and the polarity protection diode 440 are circuit components that permit the flow of current in one direction.

The first switch 450 is configured to disconnect the power source 410 from the terminals of the power storage component 420 to prevent a spark from occurring at the terminals of the power storage component 420. The first switch 450 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), or any other switch suitable for the intended purpose and understood by a person of ordinary skill in the art.

The fourth resistor 463 is electrically coupled in parallel with the power storage component 420 of the circuit 400. The fourth resistor 463 dissipates the energy stored in the power storage component 420 when the power source 410 is turned off. In this embodiment, the peak voltage across the power storage component 420 after the power source 410 is removed from the input of the circuit 400 is approximately equal to: −Vin (voltage of the power source 410) * Rsnubber (resistor value of the fourth resistor 463)/Rload (resistor value of the third resistor 462). The third resistor 462 may be a load resistor of the power storage component 420. For example, if the power storage component 420 has a resistance of 200 ohms (the third resistor 462), a 400 ohm snubber resistor (the fourth resistor 463) is electrically connected in parallel with the power storage component 420, and a 24 Vdc input power source (the power source 410) is removed from the circuit 400, the peak voltage across the power storage component 420 and the fourth resistor 463 is approximately −48V. The fourth resistor 463 may be more rugged and less prone to damage than a zener diode, a Transient Voltage Suppression (TVS) diode, or other similar devices. There is also no switching time that is associated with the fourth resistor 463, unlike a semiconductor device such as a diode.

In this embodiment, current will pass from the positive end of the power source 410, through the polarity protection diode 440, and then to the power storage component 420.

Because of the direction of the first diode 430, current does not flow from the cathode end to the anode end of the first diode 430. When the power source 410 is turned on and the first switch 450 is in a closed position, the power storage component 420 will gain potential energy and current will flow through the first switch 450 (in the closed position) and then to the negative end of the power source 410. The electrical potential in the power storage component 420 will want to dissipate when the power source 410 is disconnected from the circuit 400. When power is turned off, the first switch 450 will be in an open position, thereby preventing a flow of current to the power storage component 420. As such, current will not be able to flow from the power storage component 420 to the power source 410. Current will then flow to the fourth resistor 463 and then back to an end 422 of the power storage component 420, thereby dissipating the electrical potential stored in the power storage component 420. In the instance that the first switch 450 fails, current flows from an end 421 of the power storage component 420, through the first diode 430 and then back to the end 422 of the power storage component 420 in a circular manner.

In this embodiment, when power is connected, the first switch 450 changes to a closed position, thereby providing power to the power storage component 420. When power is disconnected from the circuit 400, the first switch 450 changes to an open position, thereby preventing power in the power storage component 420 to decay back to the power source 310.

The second diode 430 may be a redundant diode that is electrically coupled in parallel between the power source 410 and the power storage component 420. The second diode 430 assists the circuit 400 by preventing a spark between the power storage component 420 from the power source 410 in case the first switch 450 fails.

The polarity protection diode 440 also provides polarity protection to the circuit 400 by prohibiting unwanted changes of polarity in the circuit 400. The polarity protection diode 440 is also electrically coupled to the positive terminal of the power source 410.

Referring to FIG. 6, line 490 represents the current across the power storage component 420 of the circuit 400 over a period of time. Line 491 represents the voltage measured by the voltage measurement tool 470 across the power source 410 of the circuit 400 over the period of time. Line 492 represents the voltage measured by the voltage measurement tool 471 across the first diode 430 of the circuit 400 over the period of time.

Figure 7:
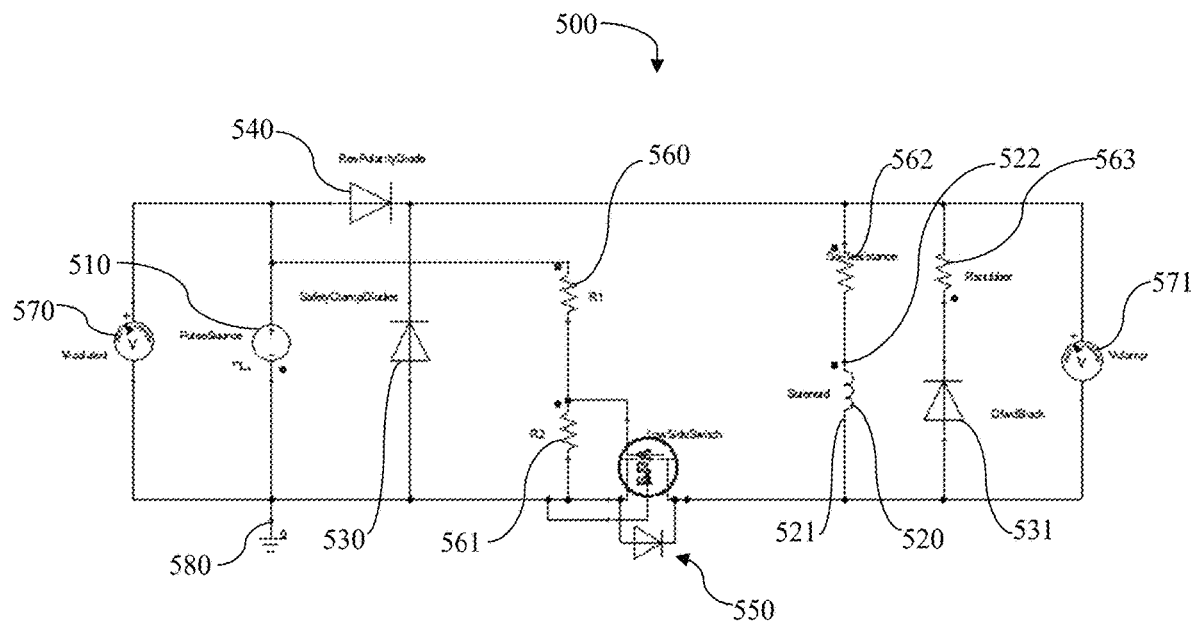
FIG. 7 is a schematic view of a fifth embodiment of an exemplary circuit.
Figure 8:
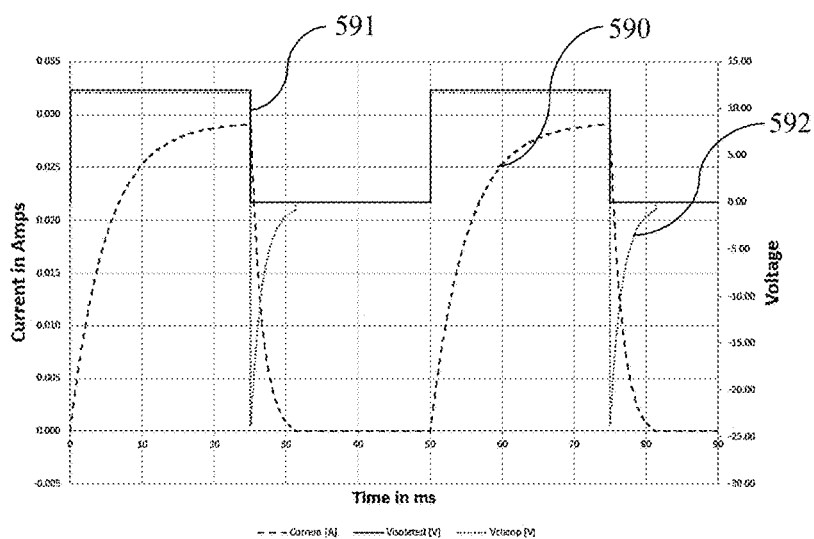
FIG. 8 is a graph of voltage measurements of the circuit of FIG. 7.

Referring to FIGS. 7 and 8, an exemplary circuit is provided, of which a fifth embodiment is generally indicated at 500. The circuit 500 is shown as broadly including a power source 510, a power storage component 520, a first diode 530, a second diode 531, a polarity protection diode 540, a first switch 550, a first resistor 560, a second resistor 561, a third resistor 562, a fourth resistor 563, and a ground terminal 580.

FIG. 7 also illustrates the circuit 500 with a voltage measurement tool 570 to measure a voltage across the power source 510, and a voltage measurement tool 571 to measure a voltage across the first diode 530. The power source 510 may be an alternating current (AC) power source or a direct current (DC) power source. The power source 510 and the power storage component 520 have corresponding positive and negative terminals. The power storage component 520 is a circuit component that stores energy such as a coil, solenoid, winding, or any other component suitable for the intended purpose and understood by a person of ordinary skill in the art. The first diode 530, the second diode 531, and the polarity protection diode 540 are circuit components that permit the flow of current in one direction.

The first switch 550 is configured to disconnect the power source 510 from the terminals of the power storage component 520 to prevent a spark from occurring at the terminals of the power storage component 520. The first switch 550 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), or any other switch suitable for the intended purpose and understood by a person of ordinary skill in the art.

The fourth resistor 563 dissipates the energy stored in the power storage component 520 when the power source 510 is turned off. The circuit 500 is similar to the circuit 400 but with the inclusion of the second diode 531 that is electrically coupled to the fourth resistor 563 in series. The second diode 531 may be a reverse blocking diode that is similar to a zener diode circuit design. The second diode 531 prevents any voltage that is being applied to the power storage component 520 from also being applied to the fourth resistor 563.

In this embodiment, when power is connected, the first switch 550 changes to a closed position, thereby providing power to the power storage component 520. When the input voltage from the power source 510 is removed from the circuit 500, the first switch 550 changes to an open position and the voltage polarity of the power storage component 520 reverses direction. The second diode 531 is then forward biased, thus allowing the energy stored in the power storage component 520 to flow through the fourth resistor 563 (the snubber resistor) and not back to the power source 510.

In this embodiment, current will pass from the positive end of the power source 510, through the polarity protection diode 540, and then to the power storage component 520. Because of the direction of the first diode 530 and the second diode 531, current does not flow from the cathode end to the anode end of the respective diodes. When the power source 510 is turned on and the first switch 550 is in a closed position, the power storage component 520 will gain potential energy and current will flow through the first switch 550 (in the closed position) and then to the negative end of the power source 510. The electrical potential in the power storage component 520 will want to dissipate when the power source 510 is disconnected from the circuit 500. When power is turned off, the first switch 550 will be in an open position, thereby preventing a flow of current to the power storage component 520. As such, current will not be able to flow from the power storage component 520 to the power source 510. Current will then flow to the second diode 531, the fourth resistor 563, and then back to an end 522 of the power storage component 520, thereby dissipating the electrical potential stored in the power storage component 520. In the instance that the first switch 550 fails, current flows from an end 521 of the power storage component 520, through the first diode 530 and then back to the end 522 of the power storage component 520 in a circular manner.

The first diode 530 may be a redundant diode that is electrically coupled in parallel between the power source 510 and the power storage component 520. The first diode 530 assists the circuit 500 by preventing a spark between the power storage component 520 from the power source 510 in case the first switch 550 fails.

The polarity protection diode 540 also provides polarity protection to the circuit 500 by prohibiting unwanted changes of polarity in the circuit 500. The polarity protection diode 540 is also electrically coupled to the positive terminal of the power source 510.

Referring to FIG. 8, line 590 represents the current across the power storage component 520 of the circuit 500 over a period of time. Line 591 represents the voltage measured by the voltage measurement tool 570 across the power source 510 of the circuit 500 over the period of time. Line 592 represents the voltage measured by the voltage measurement tool 571 across the first diode 530 of the circuit 500 over the period of time.

Figure 9:
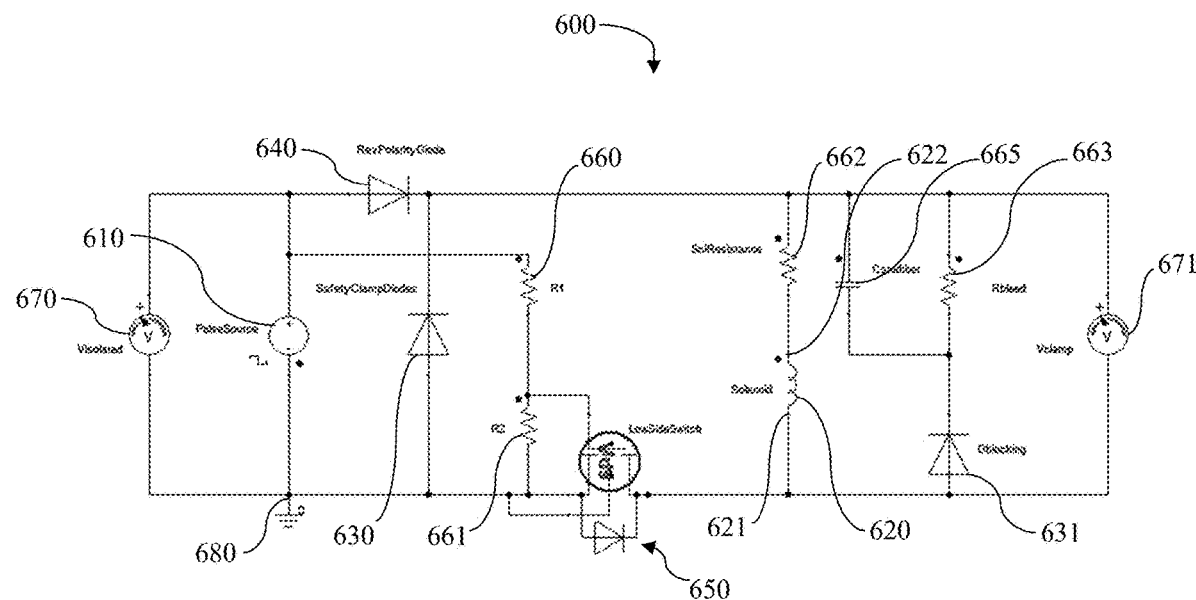
FIG. 9 is a schematic view of a sixth embodiment of an exemplary circuit.
Figure 10:
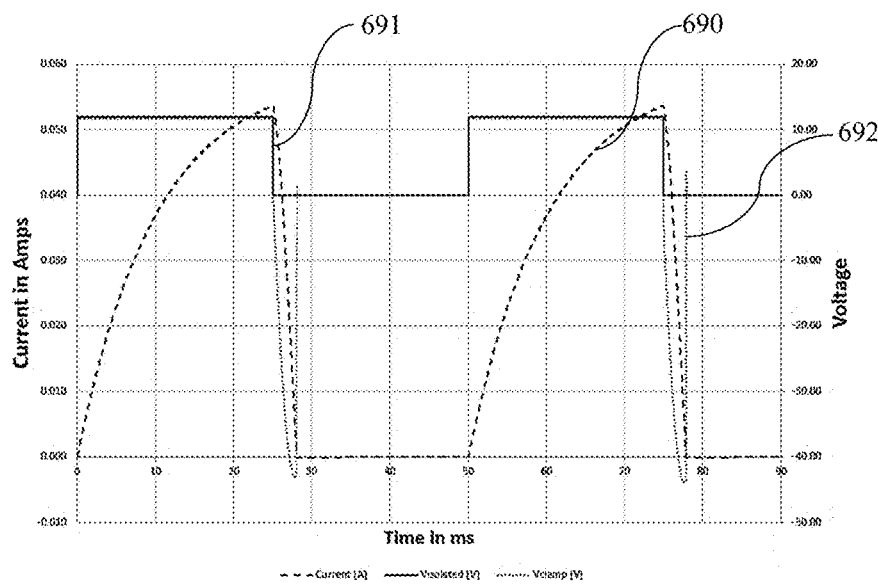
FIG. 10 is a graph of voltage measurements of the circuit of FIG. 9.

Referring to FIGS. 9 and 10, an exemplary circuit is provided, of which a sixth embodiment is generally indicated at 600. The circuit 600 is shown as broadly including a power source 610, a power storage component 620, a first diode 630, a second diode 631, a polarity protection diode 640, a first switch 650, a first resistor 660, a second resistor 661, a third resistor 662, a fourth resistor 663, a capacitor 665, and a ground terminal 680.

FIG. 9 also illustrates the circuit 600 with a voltage measurement tool 670 to measure a voltage across the power source 610, and a voltage measurement tool 671 to measure a voltage across the first diode 630. The power source 610 may be an alternating current (AC) power source or a direct current (DC) power source. The power source 610 and the power storage component 620 have corresponding positive and negative terminals. The power storage component 620 is a circuit component that stores energy such as a coil, solenoid, winding, or any other component suitable for the intended purpose and understood by a person of ordinary skill in the art. The first diode 630, the second diode 631, and the polarity protection diode 640 are circuit components that permit the flow of current in one direction.

The first switch 650 is configured to disconnect the power source 610 from the terminals of the power storage component 620 to prevent a spark from occurring at the terminals of the power storage component 620. The first switch 650 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), or any other switch suitable for the intended purpose and understood by a person of ordinary skill in the art.

In this embodiment, when power is connected, the first switch 650 changes to a closed position, thereby providing current through the polarity protection diode 640 and then to the power storage component 620. Because of the direction of the first diode 630, current does not flow from the cathode end to the anode end of the first diode 630. When the power source 610 is turned on and the first switch 650 is in a closed position, the power storage component 620 will gain potential energy and current will flow through the first switch 650 (in the closed position) and then to the negative end of the power source 610. The electrical potential in the power storage component 620 will want to dissipate when the power source 610 is disconnected from the circuit 600. When the power from the power source 610 is removed from the circuit 600, the first switch 650 changes to an open position and disconnects the power storage component 620 from the power source 610. When power is turned off, the first switch 650 will be in an open position, thereby preventing a flow of current to the power storage component 620. As such, current will not be able to flow from the power storage component 620 to the power source 610. Current will then flow to the second diode 631, the fourth resistor 633, and then back to an end 622 of the power storage component 620, thereby dissipating the electrical potential stored in the power storage component 620. In the instance that the first switch 650 fails, current flows from an end 621 of the power storage component 620, through the first diode 630 and then back to the end 622 of the power storage component 620 in a circular manner. The circuit 600 is similar to the circuit 500 but with the inclusion of the capacitor 665 that is electrically coupled to the fourth resistor 663 (a bleed resistor) in parallel. The second diode 631 (blocking diode) prevents the capacitor 665 from storing energy while power is being applied to the power storage component 620 from the power source 610.

When the circuit 600 is turned off, the discharged capacitor 665 is configured to store energy being release from the power storage component 620, thus acting as an accumulator. The fourth resistor 663 also dissipates some of the energy released from the power storage component 620 while the capacitor 665 is storing some of the energy. The size of the capacitor 665 and the fourth resistor 663 determines the peak voltage across the power storage component 620. Later, when the power storage component 620 is almost discharged in the turn-off cycle, the fourth resistor 663 slowly bleeds/dissipates the charge stored within the capacitor 665 and the power storage component 620 until both are fully discharged in preparation for the next cycle.

The fourth resistor 663 may have a higher resistance when compared to the fourth resistor 563 of the circuit 500. The second diode 631 also prevents a current inrush as the capacitor 665 may want to charge to the input voltage level of the power source 610. The inrush will slow the opening of the circuit 600 as all of the current will not be available to charge the power storage component 620.

The first diode 630 may be a redundant diode that is electrically coupled in parallel between the power source 610 and the power storage component 620. The first diode 630 assists the circuit 600 by preventing a spark between the power storage component 620 from the power source 610 in case the first switch 650 fails.

The polarity protection diode 640 also provides polarity protection to the circuit 600 by prohibiting unwanted changes of polarity in the circuit 600. The polarity protection diode 640 is also electrically coupled to the positive terminal of the power source 610.

Referring to FIG. 10, line 690 represents the current across the power storage component 620 of the circuit 600 over a period of time. Line 691 represents the voltage measured by the voltage measurement tool 670 across the power source 610 of the circuit 600 over the period of time. Line 692 represents the voltage measured by the voltage measurement tool 671 across the first diode 630 of the circuit 600 over the period of time.

Switching Devices

Figure 11:
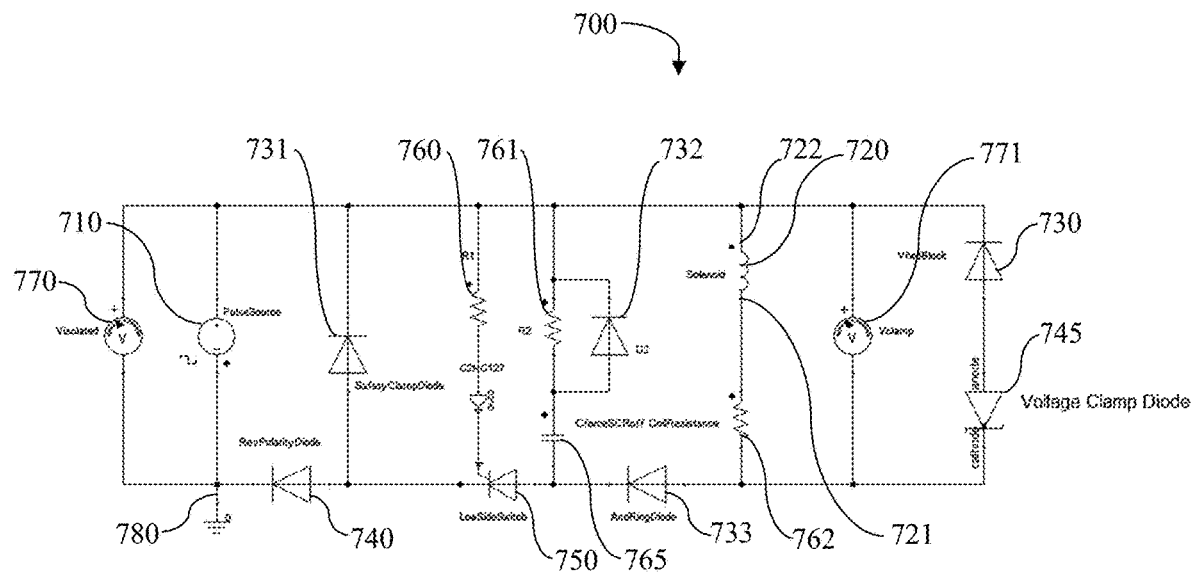
FIG. 11 is a schematic view of a seventh embodiment of an exemplary circuit.
Figure 12:
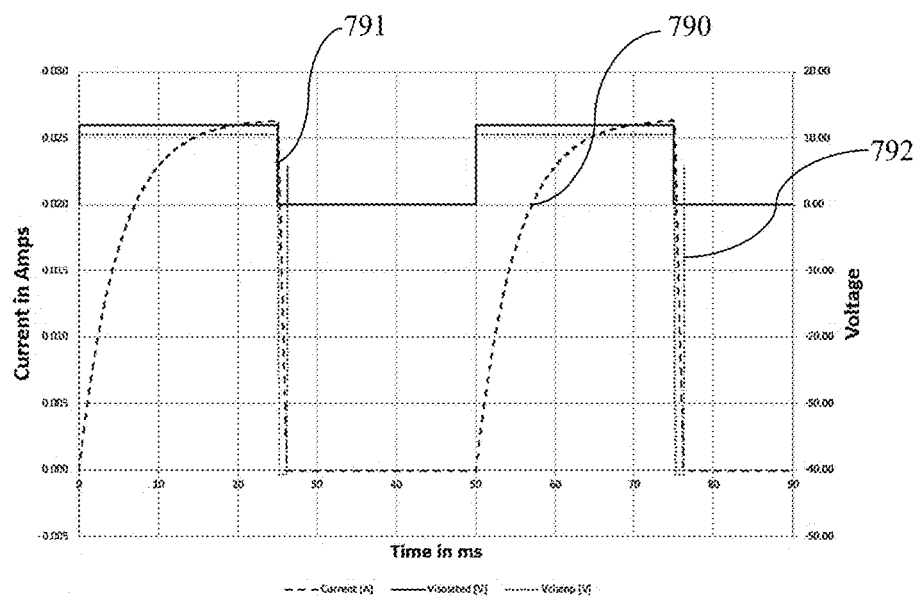
FIG. 12 is a graph of voltage measurements of the circuit of FIG. 11.

Referring to FIGS. 11 and 12, an exemplary circuit is provided, of which a seventh embodiment is generally indicated at 700. The circuit 700 is shown as broadly including a power source 710, a power storage component 720, a first diode 730, a second diode 731, a third diode 732, a fourth diode 733, a polarity protection diode 740, a zener diode 745, a first switch 750, a first resistor 760, a second resistor 761, a third resistor 762, a capacitor 765, and a ground terminal 780.

FIG. 11 also illustrates the circuit 700 with a voltage measurement tool 770 to measure a voltage across the power source 710, and a voltage measurement tool 771 to measure a voltage across the second diode 731. The power source 710 may be an alternating current (AC) power source or a direct current (DC) power source. The power source 710 and the power storage component 720 have corresponding positive and negative terminals.

The first diode 730 is electrically coupled in series with the zener diode 745, which are electrically coupled in parallel with the power storage component 720. Each of the first diode 730 and the zener diode 745 include an anode and a cathode, the anode of the first diode 730 being electrically connected to the anode of the zener diode 745. The first diode 730, the second diode 731, the third diode 732, the fourth diode 733, and the polarity protection diode 740 are circuit components that permit the flow of current in one direction. The zener diode 745 is a circuit component that directs current in a specific direction (e.g., anode to cathode of the zener diode 745) and is configured to change the direction of the current based on a voltage across the zener diode 745. Moreover, the power storage component 720 is a circuit component that stores energy such as a coil, solenoid, winding, or any other component suitable for the intended purpose and understood by a person of ordinary skill in the art. The third resistor 762 may be a load resistor of the power storage component 720.

In this embodiment, when power is connected, the first switch 750 changes to a closed position, thereby providing power to the power storage component 720. Because of the direction of the first diode 730 and the second diode 731, current does not flow from the cathode end to the anode end of the respective diodes. When the power source 710 is turned on and the first switch 750 is in a closed position, the power storage component 720 will gain potential energy and current will flow through the fourth diode 733, the first switch 750 (in the closed position), the polarity protection diode 740, and then to the negative end of the power source 710. The electrical potential in the power storage component 720 will want to dissipate when the power source 710 is disconnected from the circuit 700. When the power from the power source 710 is removed from the circuit 700, the first switch 750 changes to an open position and disconnects the power storage component 720 from the power source 710. When power is turned off, the first switch 750 will be in an open position, thereby preventing a flow of current to the power storage component 720. As such, current will not be able to flow from the power storage component 720 to the power source 710. Current will then flow to the zener diode 745, the first diode 730, and then back to an end 722 of the power storage component 720, thereby dissipating the electrical potential stored in the power storage component 720. In the instance that the first switch 750 fails, current flows from an end 721 of the power storage component 720, through the fourth diode 733, the capacitor 765, the third diode 732, and then back to the end 722 of the power storage component 720 in a circular manner.

The first switch 750 is configured to disconnect the power source 710 from the terminals of the power storage component 720 to prevent a spark from occurring at the terminals of the power storage component 720. The first switch 750 may be a bipolar transistor, a power diode, a metal oxide semiconductor field effect transistor (MOSFET), an insulated gate bipolar transistor (IGBT), a silicon controlled rectifier (SCR), a triode for alternating current switch ("TRIAC"), a diode AC switch ("DIAC"), a gate turn off thyristor ("GTO"), optical isolators that employ photo transistors, relays or any other switch suitable for the intended purpose and understood by a person of ordinary skill in the art.

The first switch 750 includes a load conduction path and a control element. In the embodiment where the first switch 750 is a MOSFET, source and drain terminals of the MOSFET are in the load conduction path and a gate terminal of the MOSFET is the control element. In the embodiment where the first switch 750 is a relay, contacts of the relay are the load conduction path, and the power storage component 720 is the control element. In the embodiment where the first switch 750 is an SCR, the SCR is turned on by applying a voltage to a gate terminal of the SCR and anode and cathode terminals of the SCR become a conduction path.

SCRs are latching devices that remain conductive until current stops flowing through the anode and cathode terminals of the SCR, even if there is no longer a voltage being applied to the control gate of the SCR. The SCR can be turned off by applying a negative voltage polarity to the circuit 700 to force the SCR to turn off. In this embodiment, this function is exemplified by a network including points R2, D2, and CforceSCRoff as shown in FIG. 11. This network applies a momentary negative voltage spike to the SCR's anode terminal, which forces off the circuit 700. The network is provided to immediately shut off the SCR after power is removed from the circuit 700. Without the network, the energy/voltage stored in the power storage component 720 may be present at the input of the circuit 700 after the power is removed from the input of the circuit 700, which the SCR would then not be able to provide the required isolation.

The second diode 731 may be a redundant diode that is electrically coupled in parallel between the power source 710 and the power storage component 720. The second diode 731 assists the circuit 700 by preventing a spark between the power storage component 720 from the power source 710 in case the first switch 750 fails.

The polarity protection diode 740 also provides polarity protection to the circuit 700 by prohibiting unwanted changes of polarity in the circuit 700. The polarity protection diode 740 is also electrically coupled to the negative terminal of the power source 710.

Initially, the circuit 700 is energized by the power source 710. With the first switch 750 in a closed position, the power storage component 720 is energized and stores power. The first diode 730 and the zener diode 745 may be a power absorption component that clamp a decay voltage of the power storage component 720 at a higher value than a typical diode. As such, the current through the power storage component 720 will decay at a faster rate.

Referring to FIG. 12, line 790 represents the current across the power storage component 720 of the circuit 700 over a period of time. Line 791 represents the voltage measured by the voltage measurement tool 770 across the power source 710 of the circuit 700 over the period of time. Line 792 represents the voltage measured by the voltage measurement tool 771 across the second diode 731 of the circuit 700 over a period of time.

It is appreciated that certain features of the disclosure, which are, for clarity, described in the context of separate embodiments, may also be provided in combination in a single embodiment. Conversely, various features of the disclosure, which are, for brevity, described in the context of a single embodiment, may also be provided separately or in any suitable subcombination.

The present disclosure contemplates that many changes and modifications may be made. Therefore, while forms of the improved claw pole motor have been shown and described, and a number of alternatives discussed, persons skilled in this art will readily appreciate that various additional changes and modifications may be made without departing from the scope of the invention, as defined and differentiated by the following claims.

What is claimed is:

1. A circuit for preventing sparks, the circuit comprising:
a power storage component having a first power storage end and a second power storage end;
a power source electrically connected to the power storage component, the power source having a first power source end having a positive polarity and a second power source end having a negative polarity;
a first current directional component electrically connected to the power storage component and having a first current direction;
a first power absorption component electrically connected to the power storage component and having a current direction, the first current directional component and the first power absorption component being electrically connected to the power storage component in parallel, the first current directional component electrically connected in series with the first power absorption component, wherein the current direction is opposite the first current direction, the first power absorption component operable to allow a flow of current in the current direction and prevent a flow of current in the first current direction;
a second current directional component electrically connected to the power storage component and having a second current direction, the second current direction of the second current directional component corresponding to the first current direction of the first current directional component, the second current directional component and the first current directional component being electrically connected to the power storage component in parallel, the second current directional component being electrically connected to the first current directional component in parallel, the second current directional component being electrically connected to the first power absorption component in parallel;
a third current directional component having a third current direction, the third current directional component electrically connected to the second power source 2/8end, the third current directional component electrically connected to the second current directional component in series, the third current directional component prevents the flow of current from the second power source end to the second current directional component, wherein the third current directional component being connected to the first current directional component in parallel, wherein the third current direc-tional component being connected to the first power absorption component in parallel, wherein the third current direction is opposite the second current direction; and
a first switch electrically connected to the power storage component, the first switch electrically connected in series between the first power source end and the first current directional component, the first switch electrically connected in series between the first current directional component and the second directional component; and
a second switch electrically connected to the power storage component in series, the second switch electrically connected to the second power storage end, the first switch and the second switch being in series with the power storage component and the first power absorption component, the second switch electrically connected in series between the power absorption component and the second current directional component.

2. The circuit of claim 1, wherein the first switch is electrically connected to the first power source end and the first power storage end, the second switch being electrically connected to the second power storage end and the second power source end, the first switch and the second switch being in series with the power storage component and the first power absorption component.

3. The circuit of claim 1, further comprising a controller that is configured to control the first switch.

4. The circuit of claim 1, wherein the first switch is further electrically connected to the power source.

5. The circuit of claim 4, wherein the first switch is configured to be in an open position when the power source is turned off.

6. The circuit of claim 1, wherein the first switch is a metal-oxide-semiconductor field-effect transistor (MOSFET) switch.

7. A method comprising:
(a) providing a power storage component having a first power storage end and a second power storage end;
(b) providing a power source connected to the power storage component, the power source having a first power source end having a positive polarity and a second power source end having a negative polarity;
(c) providing a first current directional component connected to the power storage component and having a first current direction;
(d) providing a first power absorption component electrically connected to the power storage component and having a current direction, the first current directional component and the first power absorption component being electrically connected to the power storage component in parallel, the first current directional component electrically connected in series with the first power absorption component, wherein the current direction is opposite the first current direction, the first power absorption component operable to allow a flow of current in the current direction and prevent a flow of current in the first current direction; and
(e) providing a second current directional component electrically connected to the power storage component and having a second current direction, the second current direction of the second current directional component corresponding to the first current direction of the first current directional component, the second current directional component and the first current directional component being electrically connected to the power storage component in parallel, the second current directional component being electrically connected to the first current directional component in parallel, the second current directional component being electrically connected to the first power absorption component in parallel;
(f) providing a third current directional component having a third current direction, the third current directional component electrically connected to the second power source end, wherein the third current directional component electrically connected to the second current directional component in series, the third current directional component prevents the flow of current from the second power source end to the second current directional component prevents the flow of current from the second power source end to the second current directional component, wherein the third current directional component being connected to the first current directional component in parallel, wherein the third current directional component being connected to the first power absorption component in parallel, wherein the third current direction is opposite the second current direction;

(g) providing a first switch electrically connected to the power storage component, the first switch electrically connected in series between the first power source end and the first current directional component, the first switch electrically connected in series between the first current directional component and the second directional component; and (f) providing a second switch electrically connected to the power storage component in series, the second switch electrically connected to the second power storage end, the first switch and the second switch being in series with the power storage component and the first power absorption component, the second switch electrically connected in series between the power absorption component and the second current directional component.

* * * * *